US008503808B2

(12) United States Patent
Dhand et al.

(10) Patent No.: US 8,503,808 B2
(45) Date of Patent: Aug. 6, 2013

(54) METHOD, APPARATUS, AND COMPUTER PROGRAM PRODUCT FOR COMPRESSION AND DECOMPRESSION OF AN IMAGE DATASET

(75) Inventors: Harsh Dhand, Mohali (IN); Nevenka Dimitrova, Briarcliff Manor, NY (US); Hansraj Mishra, Kharagpur (IN)

(73) Assignee: Koninklijke Philips N.V., Eindhoven (NL)

( * ) Notice: Subject to any disclaimer, the term of this patent is extended or adjusted under 35 U.S.C. 154(b) by 389 days.

(21) Appl. No.: 12/992,106

(22) PCT Filed: May 11, 2009

(86) PCT No.: PCT/IB2009/051921
§ 371 (c)(1),
(2), (4) Date: Nov. 11, 2010

(87) PCT Pub. No.: WO2009/138938
PCT Pub. Date: Nov. 19, 2009

(65) Prior Publication Data
US 2011/0069898 A1    Mar. 24, 2011

(30) Foreign Application Priority Data

May 15, 2008    (EP) .................................... 08156225

(51) Int. Cl.
*G06K 9/46*    (2006.01)
(52) U.S. Cl.
USPC .......................................... 382/243; 382/244

(58) Field of Classification Search
USPC .................................................. 382/243–244
See application file for complete search history.

(56) References Cited

U.S. PATENT DOCUMENTS

| | | | | |
|---|---|---|---|---|
| 4,984,076 A | * | 1/1991 | Watanabe et al. | 375/240.2 |
| 5,416,606 A | * | 5/1995 | Katayama et al. | 382/239 |
| 5,583,573 A | * | 12/1996 | Asamura et al. | 375/240.04 |
| 6,423,004 B1 | * | 7/2002 | Dong et al. | 600/443 |
| 7,065,251 B2 | * | 6/2006 | Yadid-Pecht | 382/232 |
| 7,139,415 B2 | * | 11/2006 | Finkbeiner | 382/128 |
| 7,286,712 B2 | | 10/2007 | Lee et al. | |
| 2004/0126033 A1 | * | 7/2004 | Ishizaka | 382/254 |
| 2004/0197013 A1 | * | 10/2004 | Kamei | 382/118 |
| 2009/0324070 A1 | * | 12/2009 | Hayashi | 382/165 |
| 2012/0141041 A1 | * | 6/2012 | Song et al. | 382/238 |

OTHER PUBLICATIONS

Goshtasby, A.: "Design and Recovery of 2-D and 3-D Shapes Using Rational Gaussian Curves and Surfaces"; International Journal of Computer Vision, 1993, vol. 10, No. 3, pp. 233-256.

Liao et al: "Curve and Surface Interpolation Using Rational Radial Basis Functions"; Proceedings of the 1996 International Conference on Pattern Recognition (ICPR'96), IEEE, vol. 4, pp. 8-13.

* cited by examiner

*Primary Examiner* — Jingge Wu (57) ABSTRACT

A method for compression and/or decompression of biomedical images such as DNA sequencing images is provided. The method comprises regeneration of a complete image using multiple distribution functions generated on the fly. The compression ratio achieved is in the order of 10 to 20 times, and is near lossless with respect to the clinically relevant information; which makes it well suited for these DNA sequencing images.

9 Claims, 7 Drawing Sheets

METHOD, APPARATUS, AND COMPUTER PROGRAM PRODUCT FOR COMPRESSION AND DECOMPRESSION OF AN IMAGE DATASET

FIELD OF THE INVENTION

This invention pertains in general to the field of gene sequencing. More particularly the invention relates to a compression method for gene sequencing images.

BACKGROUND OF THE INVENTION

Gene sequencing is a field of active research today. An understanding of the genome variation will enable us to fully understand the issues of genetic susceptibility and pharmacogenomics of drug response for all individuals as well as personalized molecular diagnostic tests. The main issue with genomic sequencing today is the cost involved.

The gene-sequencing images representing DNA sequences generated by fluorescence or microarray techniques are very large in size. Moreover, the images are sparse in terms of real information, and often have an appearance similar to celestial images.

Many methods of carrying out the sequencing process have been proposed, but few are promising enough to bring the cost within affordable levels. One particular approach has been developed by Solexa Technologies. They employ the sequencing-by-synthesis method, wherein fragmented gene samples are first localized in a high-density array of colonies of identical copies. They are then cyclically added with nucleotides labeled with fluorophores and the emitted fluorescence is used to determine the sequence of bases in the fragment, one at a time. During every cycle, the fluorescence emitted by the colonies on the chip is captured in the form of bio-medical images: 4 images per cycle (for A, C, G and T) for an average thirty base pairs. At the end of the operation the size of the images cumulatively are in the order of terabytes.

Accordingly, the sequencing images e.g. resulting from the sequencing-by-synthesis method often have massive sizes. The sets of uncompressed images quickly reach the order of terabytes in matter of a few weeks and are henceforth unsuitable for archiving purposes.

Figure 1A:
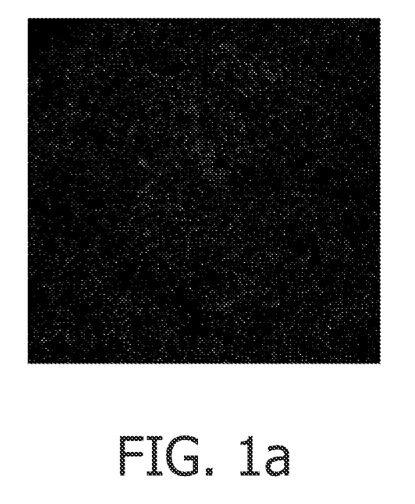
FIG. 1a is an illustration showing a segment of an original gene-sequencing image.
Figure 1B:
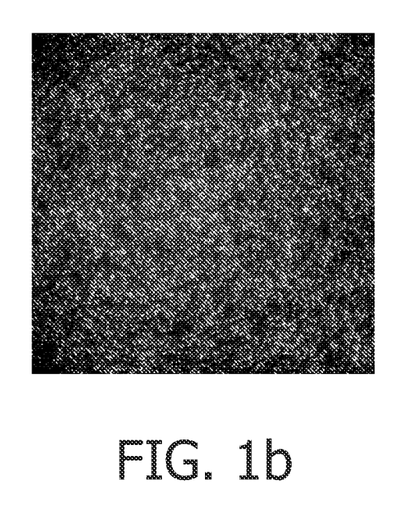

FIG. 1a shows a segment of an original gene-sequencing image and FIG. 1b shows an enhanced gene-sequencing image, which shows the overall density of the image. Based on FIGS. 1a and 1b it is difficult to categorically say, which part pertains to information and which part pertains to noise. Although there are indications that only a few bright clusters or spots represent real information, i.e. nucleotide base pairs, while the rest is noise obtained by light diffraction, while obtaining the images.

Figure 2:
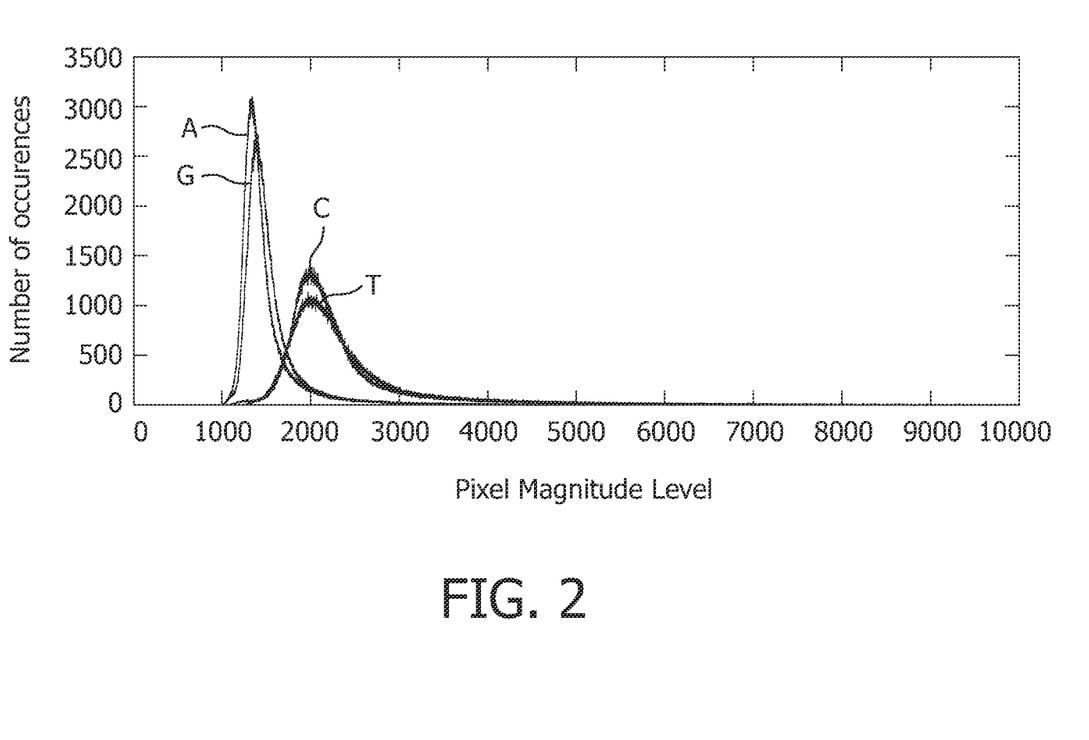
FIG. 2 is a diagram illustrating a distribution of pixel intensity around a peak in a gene-sequencing image.

FIG. 2 is a diagram illustrating a typical histogram of gene-sequencing images for four bases in the same cycle in the higher pixel values. Therefore, the tail of the histogram corresponds to values that are critical and must be preserved.

Accordingly, no commonly known compression techniques are able to store the information in genetic sequence images in a satisfactory manner, both in the lossy as well as the lossless domains. Lossy means that there is some information loss between the original image and the decompressed image (obtained from compressed image). If there is no information loss between the original and decompressed images this may be referred to as lossless compression. Each gene-sequencing image comprises too much data, and not all of it is important for regeneration of the genome sequence. Some commonly known methods utilizes direct thresholding which removes most of the noise data, but also removes spots of lower intensity that might be of clinical relevance.

Hence, there is a need for being able to transmit and archive gene-sequencing images across companies and academic institutions. However, the massive size of these images is a limiting factor. Hence, and improved method, apparatus, and computer program product for use in compression and decompression of an image dataset would be advantageous.

SUMMARY OF THE INVENTION

Accordingly, the present invention preferably seeks to mitigate, alleviate or eliminate one or more of the above-identified deficiencies in the art and disadvantages singly or in any combination and solves at least the above-mentioned problems by providing a method, and apparatus according to the appended patent claims.

In an aspect of the invention a method for use in compression of an image dataset is provided. The method comprises separating a first set of pixels pertaining to information from a second set of pixels pertaining to noise in an image dataset, wherein each pixel in the first set of pixels pertains to a peak of information in the image dataset. The separating step is performed by identifying a minimum pixel value $\hat{m}_r$ in the image dataset. The separation step may further comprising calculating a standard deviation $\sigma_r$ of the pixel values with respect to the minimum pixel value $\hat{m}_r$, wherein a pixel $x_r$ of the image dataset is defined to pertain to the second set of pixels if the pixel $x_r$ fulfills $\hat{m}_r \leq x_{rs} \leq \hat{m}_r + N_{Th} \times \hat{\sigma}_r$, and pixel $x_{ij}$ of the image dataset is defined to pertain to the first set of pixels if the pixel $x_{ij}$ is a local maxima and does not fulfill $\hat{m}_r \leq x_{ij} \leq \hat{m}_r + N_{Th} \times \hat{\sigma}_r$, wherein $N_{th}$ is a noise threshold parameter.

In another aspect of the invention a method for decompression of a compressed image dataset comprising a sparse matrix containing a first set of pixels pertaining to information in an original image dataset, and a header containing a second set of pixels pertaining to noise the original image dataset is provided. The method comprises growing information around a first set of pixels comprised in the sparse matrix of the compressed image dataset, resulting in regenerated information. The method further comprises growing noise information around the second set of pixels based on the distribution parameters comprised in the header of the compressed image dataset, resulting in regenerated noise. The method further comprises regenerating a decompressed image dataset based on the regenerated information and the regenerated noise.

In yet another aspect of the invention an apparatus for use in compression of an image dataset is provided. The apparatus comprises a separation unit configured to separate a first set of pixels pertaining to information from a second set of pixels pertaining to noise in an image dataset, wherein each pixel in the first set of pixels pertains to a peak of information in the image dataset. The separation unit further comprises an identification unit (711) configured to identify a minimum pixel value $\hat{m}_r$ and a maximum occurring pixel value $\hat{M}_r$ in the image dataset. The separation further comprises a calculation unit (712) configured to calculate a standard deviation $\sigma_r$ of the pixel values with respect to the minimum pixel value $\hat{m}_r$, and wherein said separation unit is further configured to classify a pixel $x_r$ of the image dataset to pertain to the second set of pixels if the pixel $x_r$ fulfills $\hat{m}_r \leq x_{rs} \leq \hat{m}_r + N_{Th} \times \hat{\sigma}_r$, and pixel $x_{ij}$ of the image dataset is defined to pertain to the first set of pixels if the pixel $x_{ij}$ is a local maxima and does not fulfill $\hat{m}_r \leq x_{ij} \leq \hat{m}_r + N_{Th} \times \hat{\sigma}_r$, wherein $N_{Th}$ is a noise threshold parameter.

In another aspect of the invention an apparatus for decompression of a compressed image dataset comprising a sparse matrix containing a first set of pixels pertaining to information in an original image dataset, and a header containing a second set of pixels pertaining to noise the original image dataset. The apparatus comprises a unit configured to grow information around a first set of pixels comprised in the sparse matrix of the compressed image dataset, resulting in regenerated information. The apparatus also comprises a unit configured to grow noise information around the second set of pixels based on the distribution parameters comprised in the header of the compressed image dataset, resulting in regenerated noise. The apparatus also comprises a unit configured to regenerate a decompressed image dataset based on the regenerated information and the regenerated noise.

In another aspect of the invention a computer program product is provided for performing any of the steps of the method according to some embodiments.

An object with the invention according to some embodiments is to effectively reduce the storage space for sequencing and microarray images. For posterity reasons these images are important and may need to be archived in the longer term and compression makes this feasible.

The method and apparatus according to some embodiments enables archiving of these images and provides a suitable degree of compression while still maintaining the information integrity.

The present invention according to some embodiments discloses a compression method specifically tailored for gene sequencing images. The method is based on a novel idea of regeneration of complete image, by multiple distribution function, generated on the fly. The compression ratio achieved is in the order of 10 to 20 times, and is near lossless with respect to the clinically relevant information, which makes it well applicable on DNA Sequencing images.

The method according to some embodiments provides for very high compression ratio, such as in the order of 10 and above while not losing underlying important sequencing data.

The method according to some embodiments takes advantage of the image characteristics of the DNA compression images—which have mostly dark areas and a few bright spots.

The method according to some embodiments comprises a noise-growing step that reduces the image information that needs to be stored.

BRIEF DESCRIPTION OF THE DRAWINGS

These and other aspects, features and advantages of which the invention is capable of will be apparent and elucidated from the following description of embodiments of the present invention, reference being made to the accompanying drawings, in which

FIG. 1b is an illustration showing an enhanced version of FIG. 1a;

DESCRIPTION OF EMBODIMENTS

Several embodiments of the present invention will be described in more detail below with reference to the accompanying drawings in order for those skilled in the art to be able to carry out the invention. The invention may, however, be embodied in many different forms and should not be construed as limited to the embodiments set forth herein. Rather, these embodiments are provided so that this disclosure will be thorough and complete, and will fully convey the scope of the invention to those skilled in the art. The embodiments do not limit the invention, but the invention is only limited by the appended patent claims. Furthermore, the terminology used in the detailed description of the particular embodiments illustrated in the accompanying drawings is not intended to be limiting of the invention.

The following description focuses on embodiments of the present invention applicable to gene-sequencing image datasets. However, it will be appreciated that the invention is not limited to this application but may be applied to all image datasets in which compression is desired.

The method for compression of an image dataset, such as a sequencing image, according to an embodiment operates on the spatial domain characteristics of the image dataset. One motivation for the method may be observed in FIG. 3 below in which the sub-images represent a false color cropped region from a sequencing image. Each sub-image shows the same region, thresholded by varying degrees. It may be observed that with more thresholding the regions converge around seed points, also denoted data points throughout this specification. Using a reverse method, these seed points could be used for exactly recreating the original image dataset, if there is some known correlation between the data and the information in these points. This gives the motivation for the method of compression based on thresholding, and a method for decompression, i.e. regeneration, of a compressed image dataset.

Figure 6A:
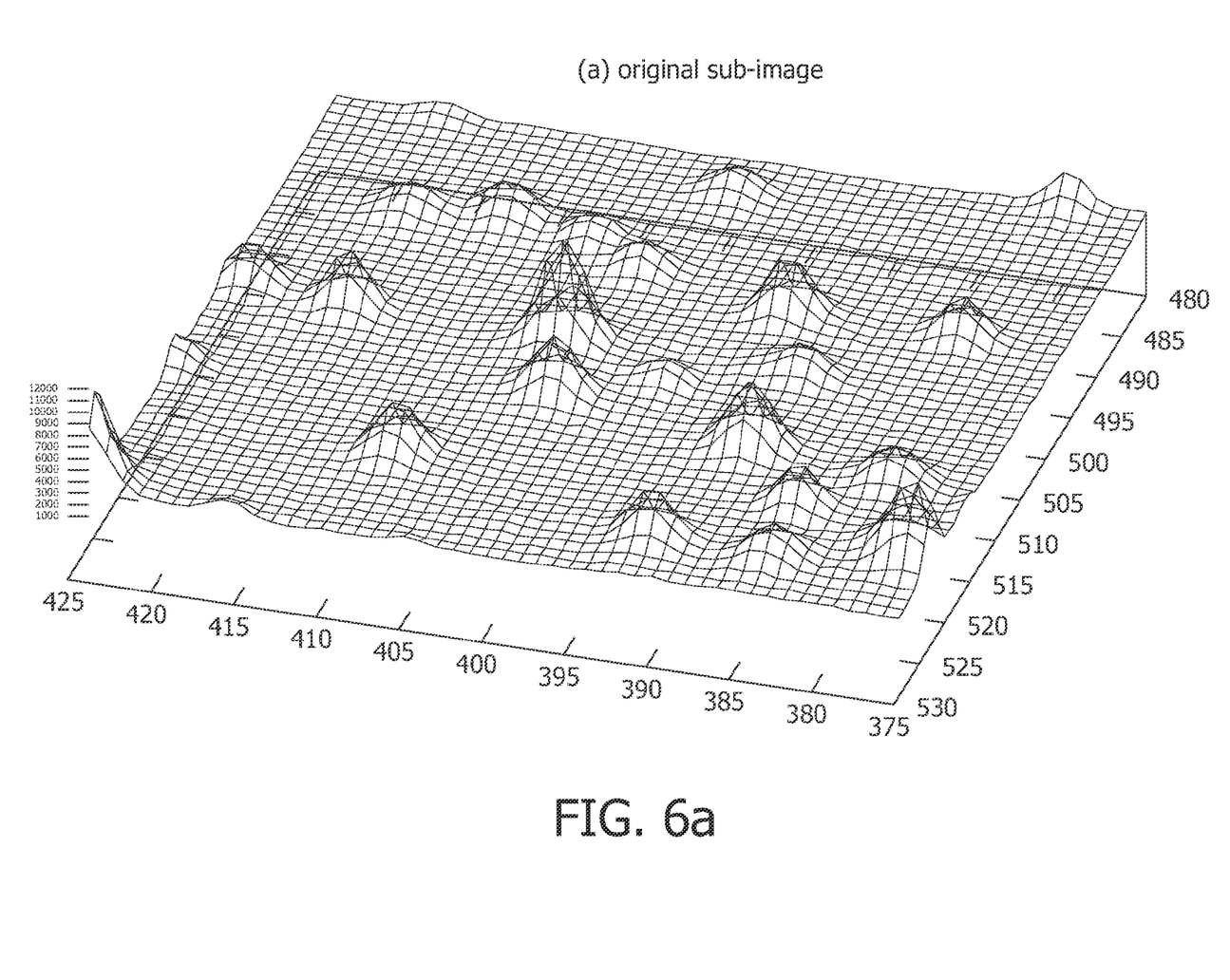
FIG. 6a is a 3D plot of an original image dataset.
Figure 6B:
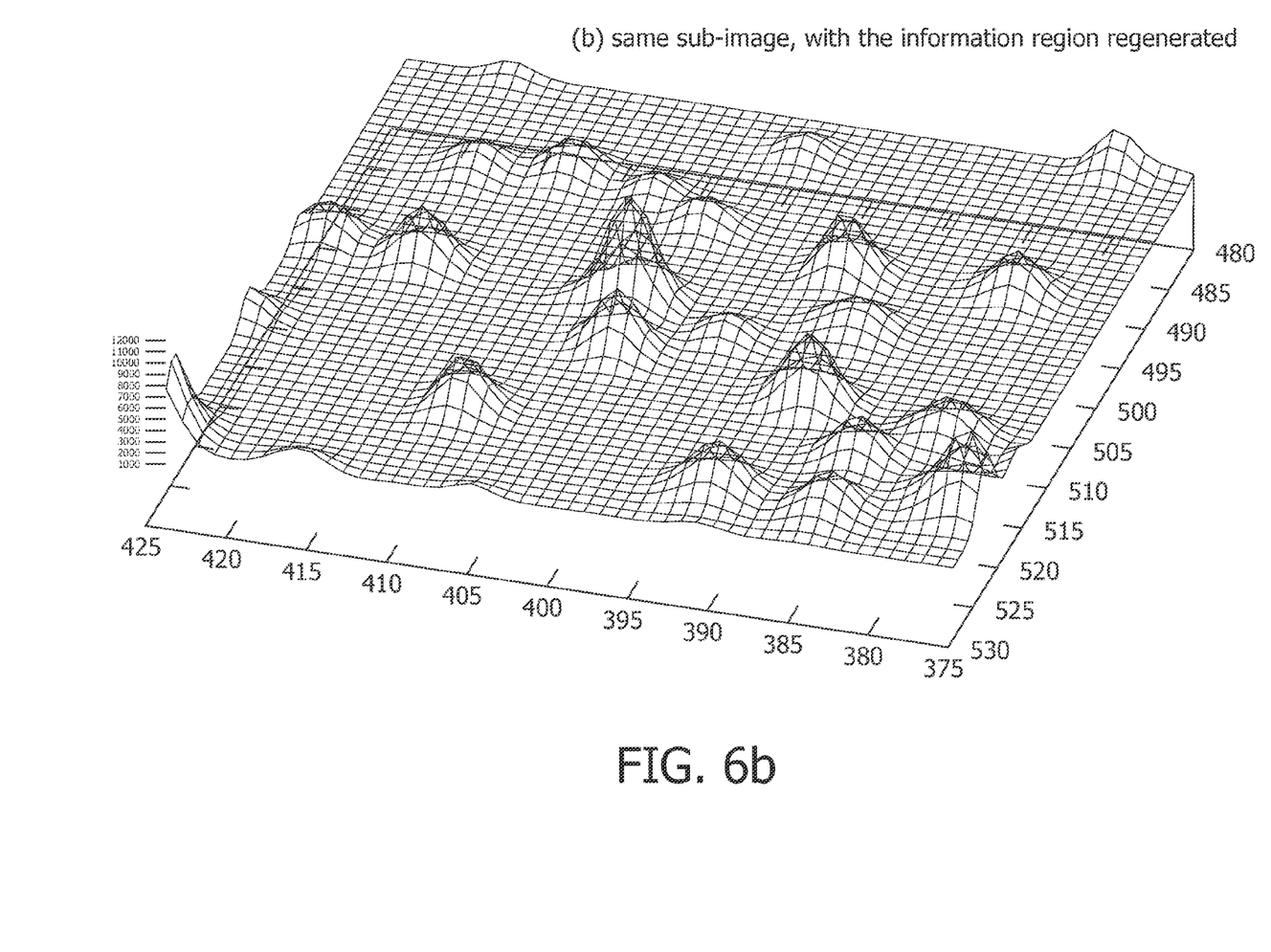
FIG. 6b is a 3D plot of a decompressed image dataset.

When considering a peak in each of the bright clusters or spots representing some information in a gene-sequencing image dataset, a few characteristics may be observed. One characteristic pertains to sudden fall in information around peaks due to intensity drop indicating that most of the information is contained around the intensity peaks. Another characteristic may pertain to a persistent noise region throughout the image. Yet another characteristic may pertain to the spread and distribution depending on peaks of information (see FIG. 6.)

Compression Method

Figure 3:
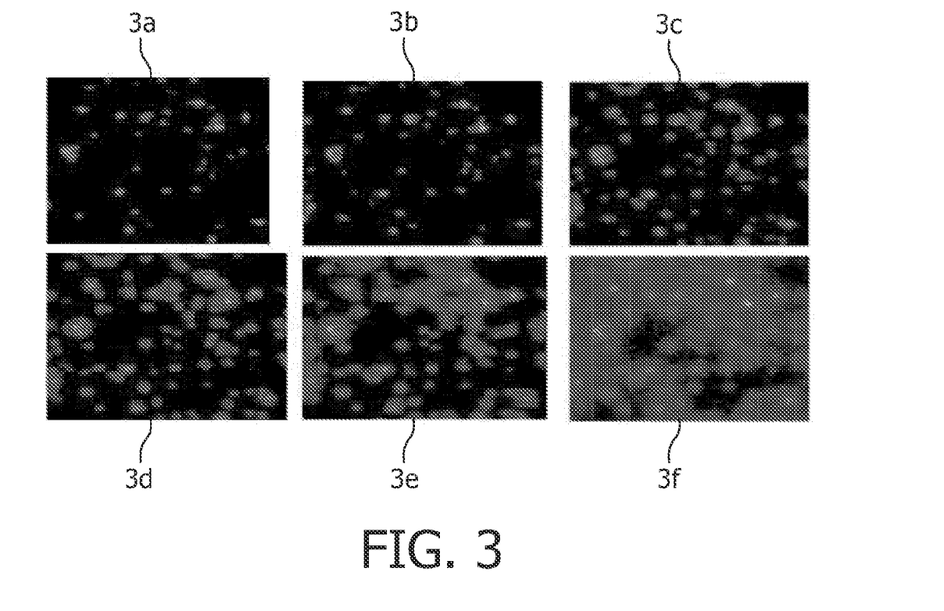
FIG. 3 is an illustration showing six sub images representing a false color cropped region from a gene-sequencing image, wherein each sub-image shows the same region, and is thresholded by varying degrees of magnitude.

FIG. 3 illustrates 6 sub images, i.e. sub regions of an image dataset, (3a to 3f) representing a false color cropped region from a gene-sequencing image. Each sub-image shows the same region, thresholded by varying degrees of magnitude. It may be observed that the initial pixels act as seeds, and gradually grow radially to increase in size, until they merge away into the surroundings comprising the noise region.

Figure 4:
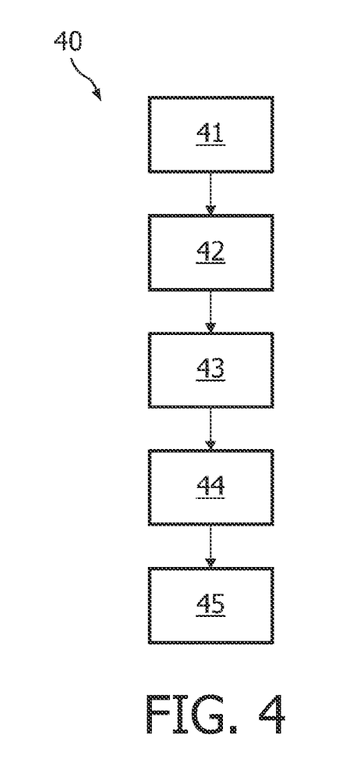
FIG. 4 is a flowchart of a compression method according to an embodiment.

In an embodiment, according to FIG. 4 a method 40 for compression of an image dataset, such as a gene-sequencing image dataset, is provided. The method comprises separating 41, noise from information the image dataset, by separating a first set of pixels pertaining to information from a second set of pixels pertaining to noise in an image dataset. Each pixel in the first set of pixels pertains to a peak of information in the image dataset.

The method may also comprise storing 42 each pixel of the first set of pixels at a corresponding position of a sparse matrix. A sparse matrix should be appreciated as a matrix populated primarily with zeros.

Furthermore, the method may also comprise determining 43 a distribution parameter(s) from the second set of pixels. The distribution parameter(s) may pertain to e.g. the standard deviation and the minimum pixel magnitude based on previously performed experiments or estimations.

The method may also comprise storing 44 the distribution parameters in a header. The header may pertain to supplemental data placed at the beginning of a block of data, e.g. at the beginning of the resulting compressed image dataset generated in the subsequent step 47, which contain information for the handling of the compressed image dataset.

Moreover, the method may comprise generating 45 a compressed image dataset based on the information in said sparse matrix and said header. The compressed image dataset may e.g. have a reduced image size by factor of 10 or more, without compromising on fidelity of information.

Briefly, the separation step 41 comprises isolating a minimum data set of the original image dataset, which may be used to reconstruct the original image with maximum fidelity later on. This information is represented by the spots in the original image dataset and the integrity of these data is of prime concern, since they represent the prime diffraction patterns which are used to identify the nucleotides. It is important when preserving information integrity to preserve sufficient information from each peak so as to subsequently be able to regenerate it. Elementary magnitude-thresholding may be used to discard lower peaks, and keep more than required information corresponding to only the higher peaks, while using local maximas with respect to the each peak in a given region also included many local-maxima in the noise regions. Hence, a thresholding scheme for use in the separation step 41 has to dynamically decide the lowest peaks which are to be considered as information.

In an embodiment the separation step is based on two phases: deciding upon lowest peaks to be considered as information; and then evaluating the local maxima.

In an embodiment the separation step 41 comprises separating a set of first pixels comprising information of high importance from a set of second pixels comprising information of low importance. The first set of pixels may be comprised in a so-called high information region, and may also referred to as data-pixels or control-pixels or information-peaks. The second set of pixels may be comprised in a so-called low information region and pertain to noise.

Using sub images will give better statistical results because a peak is evaluated in the context of its immediate neighborhood—and not the entire image. If the rank is greater than a noise threshold parameter, which may be determined based on experiments, then the information pixel is retained as a data-pixel that pertains to the first set of pixels. If not, it is discarded. In this way the sparse matrix may be constructed in storing step 42 based on the separated first set of pixels.

Consider the r:th sub-image of the original image. The separation step 41 may then comprise identifying 411 the minimum pixel value $\hat{m}_r$ and optionally the maximum occurring pixel value or mode $\hat{M}_r$ in the image dataset. Next, the standard deviation $\hat{\sigma}_r$ of the pixel values with respect to $\hat{m}_r$ may be calculated 412 as:

$$\hat{\sigma}_r = \sqrt{\frac{1}{N-1} \sum_{x_{rs} \in X} (x_{rs} - \hat{m}_r)^2}, \text{ wherein}$$

$X_r = \{x_{r1}, x_{r2}, \ldots, x_{rN}\}$ is the set of N pixels in the r:th subimage. Moreover, the r:th pixel $x_{rs}$ of the s:th sub-image may be considered as noise if, $\hat{m}_r \leq x_{rs} \leq \hat{m}_r + N_{Th} \times \hat{\sigma}_r$, wherein $\hat{m}_r$ and $\hat{\sigma}_r$ are the minimum and standard deviation of the sub-image under consideration, respectively, and wherein. Here, Nth is a noise threshold parameter.

For some image datasets, such as some DNA sequencing images, the inventors have shown that $N_{Th}$=0.65 may be used. Using this $N_{th}$ during experiments has given the lowest possible Signal-to-noise ratio (where signal is the lowest information peak and noise is the mode $\hat{m}_r$ in the region) of ~3 dB. Peak detection of this accuracy has been proven to be sufficient for subsequent regeneration purposes.

From amongst the thresholded pixels the local maximas may be determined.

This leaves the sub-image with only around $\frac{1}{15}^{th}$ to $\frac{1}{20}^{th}$ nonzero elements, when working with DNA sequencing images at the parameter values as specified above. Hence, these sub-images may be taken as sparse matrices, for which there exist a host of lossless compression schemes.

The principle used to isolate local-maxima suitable for reconstruction is to identify the rank R of each pixel (the parameter to determine the local maxima) in the sub-image being considered. In order to do so, a mask $M_{p \times p}$ is applied to each pixel $x_{ij}$ of the 2-dimensional sub-image such that $x_{ij}$ is the central element. p, the dimension of the mask, is an odd integer greater than one. The Rank of pixel xij is then defined as:

$R(x_{ij})$=number of elements in $M_{p \times p}$ lesser than $x_{ij}$ wherein $R(x_{ij})$ is the rank of an information pixel x at position (i,j) in a sub-image of the original image dataset, with respect to all other pixels in a p×p surrounding matrix $M_{p \times p}$. Now, if the rank $R(x_{ij})$ for the pixel $x_{ij}$ is found to be greater than or equal to a constant R0, which may be taken constant for the given set of sequencing images, the pixel $x_{ij}$ qualifies as a local-maxima. Next, $x_{ij}$ is tested using the inequality $\hat{m}_r \leq x_{rs} \leq \hat{m}_r + N_{Th} \times \hat{\sigma}_r \ldots$. If it qualifies as information, it is retained, else discarded.

The results of utilizing p=3 and $R_0$ in the method according to some embodiments is presented in FIGS. 6a and 6b, wherein FIG. 6b illustrates a decompressed image dataset and FIG. 6a illustrates the original image dataset.

In an experiment made by the inventors all the sub-images were merged to compose a large sparse matrix of the dimensions of the original image dataset, and converted the large sparse matrix to an Lempel-Ziv-Welch (LZW), which is a universal lossless data compression algorithm, compressed 16 bit TIFF image.

Decompression Method

Figure 5:
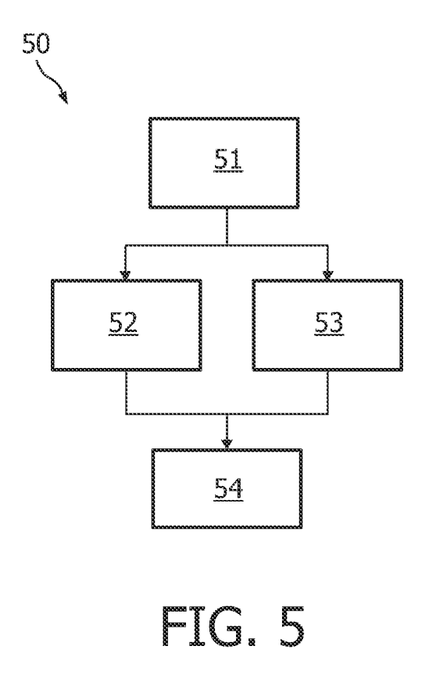
FIG. 5 is a flowchart of a decompression method according to an embodiment.

FIG. 5 is a flow chart showing a method for decompression of a compressed DNA-sequencing image. The method comprises receiving 51 a compressed image dataset, growing 52 information around the first set of pixels comprised in the sparse matrix of the compressed image dataset, resulting in regenerated information, growing 53 noise information around the second set of pixels based on the distribution parameters comprised in the header of the compressed image dataset, resulting in regenerated noise, regenerating 54 a decompressed image dataset based on the regenerated information and the regenerated noise.

Growing Information Step 52

According to some embodiments an idea is to regenerate an entire image based on only the first set of pixels pertaining to the high information region, using appropriate regeneration functions, which are determined continuously, e.g. on the fly.

In the decompression stage, information is to be grown back from the seed information. This is an interpolation problem as given a sparsely scattered data set it is desired to reconstruct a surface using the compressed image dataset. The reconstructed surface should as closely as possible follow the surface representation of the original image dataset.

The present inventors have investigated two general procedures that could be used in this regard, e.g. reconstruction using fractal interpolation functions, and a generalized procedure for scattered data interpolation.

With fractals the regeneration process proceeds slowly, and even after six regeneration-iterations, a significant portion of the original sparse image is yet to be filled. Another drawback of this approach is that it fails to exploit the characteristics of the peaks of information, such as the radial symmetry of the peaks, in the original image dataset.

Instead of using the fractal interpolation approach a more general scattered data interpolation approach may be used.

The general problem of scattered data interpolation in two dimensions is: given a set of n irregularly distributed points $P_i=(x_i, y_i), i=1, \ldots, n$ over, $R^2$, and scalar values $F_i$ associated with each point satisfying $F_i=F(x_i;y_i)$ for some underlying function $F(x;y)$, look for an interpolating function $\bar{F} \approx F(x,y)$ such that for $i=1, \ldots, n, \bar{F}(x_i,y_i)=F_i$. The interpolation function may be used to reconstruct the high information region. The points $P_i$ (the peaks or spikes or control-vertices), are all assumed distinct in the above problem and non collinear. If a function $\bar{F}$ can be found that satisfies equation 4 and follows the profiles of the peaks closely, then it can be used to reconstruct the peaks in the information region with high fidelity. To construct such a function, it is needed to identify the profile of a typical peak in the information region.

An interesting observation is that DNA-sequencing image may be quite similar to celestial or astronomical images. The profiles of the peaks in celestial images is very similar to that of peaks in the sequencing images, since they both have their origin in diffraction of a point source of light. The spectral analysis of a star profile may show that the point spread function (PSF) created by the diffraction through the earth's atmosphere has a circular symmetry, and may be approximated by a Gaussian function $$g(i,j) = g_0 e^{\frac{(i-i_0)^2+(j-j_0)^2}{2\sigma^2}} + B$$

where $g_0$ is the maximum value of the peak of the star profile, $i_0; j_0$ is the position of the star, s is the width of the star profile and B is the sky-level intensity. A surface interpolation technique, such as the one developed by Goshtasby [*Ardeshir Goshtasby. Design and recovery of 2-d and 3-d shapes using rational gaussian curves and surfaces. International Journal of Computer Vision,* 10, 1993] and later generalized by Liao et al. [*J. K. Aggarwal and Wen-Hung Liao. Curve and surface interpolation using rational radial basis functions. Pattern Recognition, Proceedings of the* 13*th International Conference on,* 4, 1996.] may be used according to an embodiment. This technique pertains to interpolation of curves and surfaces using rational radial basis functions. The main motivation for utilizing this technique is that the Gaussian may be used not only to reconstruct an isolated peak's profile, but at the same time, the sum of Gaussians corresponding to a set of spikes in close proximity of one-another closely resembled a Gaussian again.

$\bar{F}$ may be used as a radial function for the interpolation.

Given a sequence of control points, such as the pixels of the first set of pixels: $\{V_i: i=1 \ldots, n\}$, the function to approximate these points by constructing Gaussians at each, is given as $$\bar{F}(x, y) = \sum_{i=1}^{n} w_i V_i G_i(x, y), \quad \text{(eqn 1)}$$

where $G_i(x;y)$, the $i^{th}$ radial basis function is a Gaussian function with a standard deviation $\sigma_i$ having radial symmetry centered at this data-point x,y:

$$G_i(x, y) = \exp\left(\frac{-[(x-x_i)^2 + (y-y_i)^2]}{2\sigma_i^2}\right) \quad \text{(eqn 2)}$$

and $w_i$ is the weight assigned to the $i^{th}$ control point for reconstruction, while $(x_i;y_i)$ is the position of the control point of magnitude $V_i$. Accordingly, $V_i$ denotes the magnitude or intensity of the $i^{th}$ data-point, as obtained from the sparse-matrix.

Some DNA sequencing images may also require that the Gaussians should not be based at zero magnitude. It would be more appropriate if they had their ground-level somewhere in the region of the noise.

Using the smaller images, the ground level for all the Gaussians Gi(x;y) functions may be defined as the minimum pixel magnitude of the given $\hat{m}_r$ of the given $r^{th}$ sub-image ($\{\hat{m}_r: r=1, \ldots, R\}$ is placed in the header information during compression. Next, $\hat{m}_r$ may be subtracted from all the non-zero elements (the starting spikes) to get $\{V_i: V_i=P_i-\hat{m}_r, i=1 \ldots, n\}$. The set Vi may be used as a set of control points, and accordingly equation 1 may be restated as $$\bar{F}_r(x, y) = \sum_{i=1}^{n} \omega_i V_i G_i(x, y) + \hat{m}_r \quad \text{(eqn 3)}$$

where the symbols have the same meanings as in equation 1 while the subscript r in $\bar{F}_r$ denotes that this is the interpolation function for the $r^{th}$ sub-image.

For the evaluation of $\{w_i: i=1 \ldots, n\}$ it is needed to observe that there is n equations corresponding to the values of $\bar{F}_r$ i.e., $$\bar{F}_r(x_i,y_i)=V_i+\hat{m}_r, i=1, \ldots n \quad \text{(eqn 4)}$$

It is known that the functions $G_i$ being used are radially symmetric. Hence, equation 2 may be restated as $$\hat{G}_i(r)=G_i(x,y), \quad \text{(eqn 5)}$$

where r is the radial distance between the points (x;y) and $(x_i;y_i)$. Using equations 3, 4 and 5, the n equations may be re-written in matrix form:

$$\begin{pmatrix} V_1 \\ \vdots \\ V_n \end{pmatrix} = \begin{pmatrix} V_1\hat{G}_1(d_{11}) & \cdots & V_n\hat{G}_n(d_{1n}) \\ \vdots & \ddots & \vdots \\ V_1\hat{G}_1(d_{n1}) & \cdots & V_n\hat{G}_n(d_{nn}) \end{pmatrix} \begin{pmatrix} w_1 \\ \vdots \\ w_n \end{pmatrix}, \text{ or simply}$$

$$\overline{V} = \tilde{M}_{n \times n} \overline{\omega}$$

where $d_{ij}$ is the radial distance between any two control points i and j. The matrix $\tilde{M}_{n \times n}$ may be observed to be essentially sparse in nature, i.e. having many values very close to zero. This facilitates a computationally less expensive inversion. An important parameter set that needs to be considered is the set of the variances of all the Gaussians corresponding to each of the control points. i.e., $\{\sigma_i: i=1, \ldots, n\}$. It is now required that both Vi and its neighbouring information is to be captured, which is not possible in common methods e.g. keeping of $\sigma_i=\sigma_{const} \forall i \in (1,n))$ or $\sigma_i$ based on sensitivity to local data.

In an embodiment it is assumed that the control points should all have $\sigma_i$'s which are almost identical in magnitude. Control points having higher magnitude $V_i$, should have more spread as compared to those having lesser magnitudes. $V_i$'s vary by multiples, such as from 2000 to 8000 on an average, while for the purpose of reconstruction it may require a very small variation of $\sigma_i$'s.

In an embodiment the growing step 32 comprises utilizing the following formula:

$$\sigma_i = A_r \log(V_i)$$

wherein $A_r$ is the constant of proportionality for each of the sub-images, and $V_i$ is the set of control point in the r:th sub-image. This formula pertains to the evaluation of the spread of the i$^{th}$ radial-basis-function. The evaluation of the constant $A_r$ is done on the basis of an assumption that if there is a hypothetical control point at the mode $M_r$, then it should have a $\sigma$ equal to a constant which is common to all images of a given set according to the equation:

$$A_r \log(\hat{M}_r) = \sigma_{mode},$$

wherein $\sigma_{Mode}$ is the $\sigma$ equal to a constant common for all images if there is a hypothetical control point at the maximum occurring pixel value $\hat{M}_r$. This assumption made by the present inventors has produced very promising results. An example subimage, regenerated without the noise region having been considered is shown in FIGS. 5a and 5b. The flat base upon which all the Gaussians are constructed is actually the minimum pixel value $\hat{m}_r$ of this sub-image. As may bee observed, the information region has grown as expected, and qualitatively FIGS. 5a and 5b look very similar. The number of control vertices for an average 50×50 sub-image varies between 60 and 150. This means that that the information regeneration may be achieved using only 60/2500 to 150/2500 of the total number of pixels.

Growing of Noise Step 53

In the previous subsection it was discussed how to regrow the information region, and the noise regions of the original image were assigned the minima $\hat{m}_r$ of the sub-images they belong to. The noise region is persistent by nature and spread around the node. The filling of noise in any of the sub-images may be, by analogy, compared to that of filling of a liquid in a petridish, having a base at pixel value equal to the minimum of the region $\hat{m}_r$.

For growing noise it may be undesirable to use an interpolation function $F_r(x,y)$ based on a Gaussian function as it based on experiments, by comparing original image datasets to reconstructed image datasets, have been shown that significant errors in the noise region may occur. A reason for this is that the contributing Gaussians in the interpolation function $F_r(x,y)$ die out very quickly.

When attempting to regenerate the noise region by extending the Gaussians, i.e. extending the widths $\sigma_i$, then the profiles of the peaks may get distorted. This is obviously undesirable.

Instead, according to an embodiment the growing step 53 may comprise a two step algorithm, such as the one applied on the information-regenerated image shown in FIG. 6b.

The growing step 53 may comprise identifying 531 each pixel that need to be filled with noise e.g. based on the basis of its magnitude. For example, if a pixel's height, i.e. pixel intensity, is below $2 \times (\hat{M}_r - \hat{m}_r) + \hat{m}_r$, then it may be considered as noise, and be referred to as a noise pixel.

The growing step may also comprise evaluating 532 for each noise pixel the radial distance to each of the control points.

If the distance $r_{p_{noise},i}$ from a particular control point i is less than $\alpha \times \sigma_i$, then contribution of this control point is continued to be from the Gaussian $G_i$.

If $r_{p_{noise},i} \geq \alpha \times \sigma_i$ then contribution from this control point is now that of a slower decaying radial basis function, centered at the control point i. In this way, contribution for pixel $p_{noise}$ from each flag i is reviewed. Towards the end of the growing step 53, the total noise image has been obtained.

$\alpha$ is a threshold value, which decided the extent of reach of the Gaussian, and there onwards, the slower decaying function takes over. For our purpose, we used the laplacian function as the slower decaying radial basis function to model the noise region. The Laplacian may be defined as:

$$L_i(x) = A_{Li} \exp\left(-\left|\frac{x}{a_i}\right|\right), \quad \text{(eqn 6)}$$

wherein $A_{Li}$ is a constant fraction of the i$^{th}$ data-point's value $V_i$. $a_i$ is a measure of the spread of the Laplacian function.

In equation 6, there are two parameters, $A_{Li}$ and $a_i$ to be determined corresponding to each control point i. $A_{Li}$ may be selected as either equal to $w_i V_i$, the weighted height of a control point, or, it may be selected as a fixed fraction of the height depending on the noise filling extent desired. In an embodiment $A_L = w_i V_i / 4$ may be used. And, $a_i$ is calculated as per the following constraint: at a distance of $\alpha \times \sigma_i$ from the control point i where the values of the Gaussian $w_i V_i G_i$ and the Laplacian $L_i$ are equal, i.e., they intersect.

Accordingly, the growing step 53 may comprise utilizing a second radial based function having a slow decay compared to a Gaussian function. For example, the second radial based function may be a Laplacian function.

Accordingly, the growing steps 52, 53 may comprise growing noise and data points around the first set of pixels utilizing a combination of radial basis functions, such as radial Gaussian functions and/or Laplacian functions. An advantage of using a combination of radial basis function is that the decompression method is near lossless despite that the compressed image comprises high compression rates.

Noise Threshold Parameter

In an embodiment the noise threshold parameter may be $2\times(\hat{M}_r-\hat{m}_r)+\hat{m}_r$. In this way, when a pixel's height, i.e. pixel intensity, is below $2\times(\hat{M}_r-\hat{m}_r)+\hat{m}_r$, then it may be considered as noise, and be referred to as a noise pixel.

The noise threshold parameter may be determined through experiments. The experiments may be performed by utilizing various combinations of the distribution parameters, such as e.g. $\sigma_i$ for Gaussian functions, mentioned above.

The compression method according to some embodiments may be utilized on a set of original images to identify distribution parameters. In this way the compression and decompression method may be used as a parameter search method. This parameter search method may be performed by comparing each decompressed image with each corresponding original image to check whether the error between each decompressed image and each original image becomes smaller when different distribution parameters are used. This may be performed by an exhaustive search, i.e. in which testing of each possibility sequentially in order to determine if it is the solution is performed, or using a greedy algorithm, which may be any algorithm that follows the problem solving metaheuristic of making the locally optimum choice at each stage with the hope of finding a global optimum. By utilizing such comparison the noise threshold value may be improved for a more general original image dataset.

A previously determined noise threshold value may be used as a basis for each new image dataset to be compressed, and decompressed. Accordingly, by comparing each decompressed image dataset with the original image dataset, the noise threshold parameter value and the distribution parameters for a selected distribution function may be optimized.

In an embodiment once a first set of distribution parameters have been found e.g. for a first sub image, the first distribution parameters may be used when starting processing a second sub image to arrive at new optimal distribution parameter values faster. Accordingly, using such an iterative approach by using the parameter search method will speed up the process of retrieving an optimal set of distribution parameters compared to starting each parameter search with unknown parameter values.

The parameter search method may be considered unique in the sense that it incorporate multiple distribution functions and give the maximum possible flexibility to encode the original image.

For example, when there is a distribution with rapid fall and circular spread around each pixel in the first set of pixels pertaining to information a Radial Gaussian function such as a $\text{sinc}^2$ function may be used as interpolation function.

In another embodiment, when there is a distribution with slower fall and more distributed spread around each pixel in the first set of pixels a Laplacian distribution may be used as interpolation function. Parameters may be determined from the original image information or by using an iterative parameter search approach as mentioned above.

Accordingly, different interpolation functions may be used in the method according to some embodiments depending on the type of noise comprised in the second set of pixels stored in the header of the compressed image.

Table 1 illustrates dynamic assignment of different noise distributions, i.e. interpolation functions, for regenerating data of a compressed image dataset.

TABLE 1

| Distribution type | Optional function type |
|---|---|
| Distribution with rapid fall and circular spread | Radial Gaussian function, $\text{sinc}^2$ function |
| Distribution with slower fall, more distributed spread | Laplacian function |

The distribution parameters determined in the determining step 43 may e.g. be the height of information peak, closeness of information or distance to neighboring data pixels. For each new original image dataset, the iterative parameter search may be used wherein the distribution parameters are established for each image, which established distribution parameters may serve as "features" for the iterative parameter search method. This enables classification into good and bad parameters based on the comparison of how close the decompressed image is to the original image. A classifier such as Neural Network or Support Vector machine may be trained to classify parameter sets into "good" or "bad". After the training step is the actual usage by means of compression. When a new original image dataset is to be compressed, multiple sets of parameters are generated and the set of parameters that matches the "good" set is chosen for that original image.

In the above mentioned embodiments interpolation functions such as Gaussian and Laplacian function has been disclosed. However, the method according to some embodiments is not limited only to such interpolation functions, but any interpolation function modeling the distribution of the intensity peaks of an image dataset may be used within the scope of the invention.

Applications and use of the above-described embodiments are various and the method according to some embodiments may be applicable in DNA sequencing storage and archiving methods. Moreover, the method could be used to store both DNA sequencing data as well microarray data for customers, e.g. MD Anderson performs thousands of clinical trials which produce imaging and molecular level information. Compression and storage of bio-medical images of DNA with over 10 times compression on average, with yet near lossless compression is important because allows archiving for posterity reasons.

The method according to some embodiments may be used in DNA sequencing machines enabling the images to be compressed before any transfer out of the system. The method according to an embodiment may also be used in a genomics or imaging clinical data repository, such as a genomic archiving system analogous to PACS system for diagnostic images.

In an embodiment a database, such as a Genomic Archiving System, is provided for storing a compressed and/or decompressed image resulting from utilizing the method according to some embodiment along with patient information.

Figure 7:
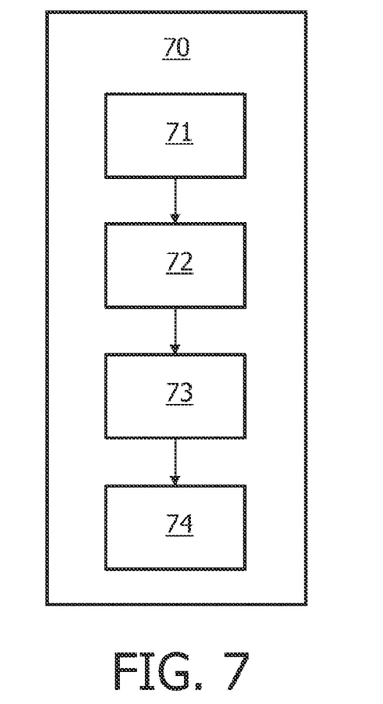
FIG. 7 is a block diagram of an apparatus according to an embodiment.

In an embodiment according to FIG. 7, an apparatus 70 for compression of an image dataset is provided, The apparatus comprises a separation unit 71 configured to separate a first set of pixels pertaining to information from a second set of pixels pertaining to noise in an image dataset, wherein each pixel in the first set of pixels pertains to a peak of information in the image dataset. The separation unit 71 apparatus may also comprise an identification unit 711 configured to identify a minimum pixel value $\hat{m}_r$ and a maximum occurring pixel value $\hat{M}_r$ in the image dataset. The apparatus may further comprise a calculation unit 712 configured to calculate a standard deviation $\sigma_r$ of the pixel values with respect to the minimum pixel value $\hat{m}_r$. The separation unit is also configured to classify a pixel $x_r$ of the image dataset to pertain to the second set of pixels if the pixel $x_r$ fulfills $\hat{m}_r \leq x_{rs} \leq \hat{m}_r + N_{Th} \times \hat{\sigma}_r$, and pixel $x_r$ of the image dataset is defined to pertain to the first set of pixels if the pixel $x_r$ does not fulfill $\hat{m}_r \leq x_{rs} \leq \hat{m}_r + N_{Th} \times \hat{\sigma}_r$, wherein $N_{th}$ is a noise threshold parameter. The apparatus may also be configured to store the first set of pixels in a sparse matrix. The apparatus may also comprise a determination unit 73 configured to determine a distribution parameter(s) from the second set of pixels, and store the distribution parameter(s) in a header. The apparatus may also comprise an image generation unit 74 configured to create a compressed image dataset based on the information in said sparse matrix and said header.

Figure 8:
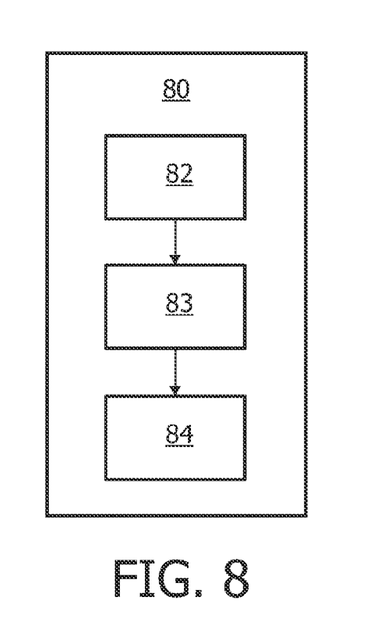
FIG. 8 is a block diagram of an apparatus according to an embodiment.

In an embodiment according to FIG. 8, an apparatus 80 for decompression of a compressed image dataset comprising a sparse matrix containing a first set of pixels pertaining to information in an original image dataset, and a header containing a second set of pixels pertaining to noise the original image dataset is provided. The apparatus comprises a unit 82 configured to grow information around a first set of pixels comprised in the sparse matrix of the compressed image dataset, resulting in regenerated information. The apparatus may also comprise a unit 83 configured to grow noise information around the second set of pixels based on the distribution parameters comprised in the header of the compressed image dataset, resulting in regenerated noise. The apparatus may also comprise an image regeneration unit 84 configured to regenerate a decompressed image dataset based on the regenerated information and the regenerated noise.

In an embodiment the apparatus comprises units configured to perform any of the features of the method according to some embodiments.

The unit(s) comprised in the apparatus according to some embodiments may be any unit normally used for performing the involved tasks, e.g. a hardware, such as a processor with a memory.

The invention may be implemented in any suitable form including hardware, software, firmware or any combination of these. However, preferably, the invention is implemented as computer software running on one or more data processors and/or digital signal processors. The elements and components of an embodiment of the invention may be physically, functionally and logically implemented in any suitable way. Indeed, the functionality may be implemented in a single unit, in a plurality of units or as part of other functional units. As such, the invention may be implemented in a single unit, or may be physically and functionally distributed between different units and processors.

In an embodiment a computer program product is provided comprising code segments for performing any of the steps of the method according to some embodiments.

Although the present invention has been described above with reference to specific embodiments, it is not intended to be limited to the specific form set forth herein. Rather, the invention is limited only by the accompanying claims and, other embodiments than the specific above are equally possible within the scope of these appended claims.

In the claims, the term "comprises/comprising" does not exclude the presence of other elements or steps. Furthermore, although individually listed, a plurality of means, elements or method steps may be implemented by e.g. a single unit or processor. Additionally, although individual features may be included in different claims, these may possibly advantageously be combined, and the inclusion in different claims does not imply that a combination of features is not feasible and/or advantageous. In addition, singular references do not exclude a plurality. The terms "a", "an", "first", "second" etc do not preclude a plurality. Reference signs in the claims are provided merely as a clarifying example and shall not be construed as limiting the scope of the claims in any way.

The invention claimed is:

1. A method for use in compression of an image dataset, comprising
separating a first set of pixels pertaining to information from a second set of pixels pertaining to noise in the image dataset, wherein each pixel in the first set of pixels pertains to a peak of information in the image dataset, by identifying a minimum pixel value $\hat{m}_r$ in the image dataset, calculating a standard deviation $\sigma_r$ of the pixel values with respect to the minimum pixel value $\hat{m}_r$, wherein a pixel $x_{ij}$ of the image dataset is defined to pertain to the second set of pixels if the pixel $x_{ij}$ fulfills $\hat{m}_r \leq x_{ij} \leq \hat{m}_r + N_{Th} \times \hat{\sigma}_r$, and pixel $x_{ij}$ of the image dataset is defined to pertain to the first set of pixels if the pixel $x_{ij}$ is a local maxima and does not fulfill $\hat{m}_r \leq x_{ij} \leq \hat{m}_r + N_{Th} \times \hat{\sigma}_r$, wherein $N_{th}$ is a noise threshold parameter.

2. The method according to claim 1, wherein the pixel $x_{ij}$ is defined to be a local maxima if it fulfills $R(x_{ij})$=number of elements in $M_{p \times p}$ lesser than $x_{ij} > R_0$, wherein $R(x_{ij})$ is the rank of an information pixel $x_{ij}$ in a sub-image of the image dataset with respect to all other pixels in a p×p surrounding matrix $M_{p \times p}$, and $R_0$ is a constant.

3. The method according to claim 1, further comprising storing the first set of pixels in a sparse matrix.

4. The method according to claim 1, further comprising determining a distribution parameter(s) from the second set of pixels and storing the distribution parameter(s) in a header.

5. The method according to claim 4, wherein said distribution parameter(s) comprises a standard deviation or minimum pixel magnitude in said image dataset.

6. The method according to claim 4, further comprising storing a distribution parameter in a header, which distribution parameter comprises a standard deviation or minimum pixel magnitude based on processing of a previous image dataset.

7. The method, according to claim 4 further comprising generating a compressed image dataset based on the information in said sparse matrix and said header.

8. An apparatus for compression of an image dataset, comprising
a separation unit configured to separate a first set of pixels pertaining to information from a second set of pixels pertaining to noise in an image dataset, wherein each pixel in the first set of pixels pertains to a peak of information in the image dataset, wherein said separation unit further comprises
an identification unit configured to identify a minimum pixel value $\hat{m}_r$ in the image dataset,
a calculation unit configured to calculate a standard deviation $\sigma_r$ of the pixel values with respect to the minimum pixel value $\hat{m}_r$, and wherein said separation unit is further configured to classify a pixel $x_r$ of the image dataset to pertain to the second set of pixels if the pixel $x_r$ fulfills $\hat{m}_r \leq x_{rs} \leq \hat{m}_r + N_{Th} \times \hat{\sigma}_r$, and pixel $x_{ij}$ of the image dataset is defined to pertain to the first set of pixels if the pixel $x_{ij}$ is a local maxima and does not fulfill $\hat{m}_r \leq x_{ij} \leq \hat{m}_r + N_{Th} \times \hat{\sigma}_r$, wherein $N_{th}$ is a noise threshold parameter.

9. A computer program product comprising code segments for performing the method according to claim 1.

* * * * *